United States Patent
Kim et al.

(10) Patent No.: US 10,103,116 B2
(45) Date of Patent: Oct. 16, 2018

(54) OPEN-PASSIVATION BALL GRID ARRAY PADS

(71) Applicant: QUALCOMM Incorporated, San Diego, CA (US)

(72) Inventors: Daeik Daniel Kim, Del Mar, CA (US); Mario Francisco Velez, San Diego, CA (US); Changhan Hobie Yun, San Diego, CA (US); Chengjie Zuo, San Diego, CA (US); David Francis Berdy, San Diego, CA (US); Jonghae Kim, San Diego, CA (US); Niranjan Sunil Mudakatte, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/077,869

(22) Filed: Mar. 22, 2016

(65) Prior Publication Data

US 2017/0221846 A1 Aug. 3, 2017

Related U.S. Application Data

(60) Provisional application No. 62/289,636, filed on Feb. 1, 2016.

(51) Int. Cl.
*H01L 23/00* (2006.01)
*H05K 1/11* (2006.01)
(Continued)

(52) U.S. Cl.
CPC .......... *H01L 24/11* (2013.01); *H01L 23/3171* (2013.01); *H01L 23/3192* (2013.01); *H01L 24/14* (2013.01); *H05K 1/111* (2013.01); *H01L 2224/11003* (2013.01); *H01L 2224/11005* (2013.01); *H01L 2224/1148* (2013.01); *H01L 2224/1405* (2013.01);
(Continued)

(58) Field of Classification Search
None
See application file for complete search history.

(56) References Cited

U.S. PATENT DOCUMENTS 5,414,297 A 5/1995 Morita et al.
5,899,729 A 5/1999 Lee
(Continued)

FOREIGN PATENT DOCUMENTS

WO 2014022418 A1 2/2014

OTHER PUBLICATIONS

International Search Report and Written Opinion—PCT/US2016/068033—ISA/EPO—dated May 16, 2017.

*Primary Examiner* — Erik Kielin
(74) *Attorney, Agent, or Firm* — Seyfarth Shaw LLP

(57) ABSTRACT

A conductive bump assembly may include a passive substrate. The conductive bump assembly may also include a conductive bump pad supported by the passive substrate and surrounded by a first passivation layer opening. The conductive bump assembly may further include a second passivation layer opening on the passive substrate. The second passivation layer opening may be merged with the first passivation layer opening surrounding the conductive bump pad proximate an edge of the passive substrate. The conductive bump assembly may also include a conductive bump on the conductive bump pad.

18 Claims, 12 Drawing Sheets

(51) Int. Cl.
  *H01L 23/31* (2006.01)
  *H05K 1/03* (2006.01)
  *H05K 3/00* (2006.01)

(52) U.S. Cl.
  CPC ............... *H01L 2224/145* (2013.01); *H01L 2224/14104* (2013.01); *H05K 1/0306* (2013.01); *H05K 3/0052* (2013.01); *H05K 2201/0154* (2013.01); *H05K 2201/0195* (2013.01); *H05K 2201/09845* (2013.01)

(56) References Cited

U.S. PATENT DOCUMENTS

| | | | |
|---|---|---|---|
| 5,998,907 A * | 12/1999 | Taguchi | H03H 9/02574 310/313 R |
| 6,348,363 B1 | 2/2002 | Chung et al. | |
| 6,365,443 B1 | 4/2002 | Hagiwara et al. | |
| RE43,605 E * | 8/2012 | O'Brien | B23K 26/032 219/121.62 |
| 8,513,776 B2 | 8/2013 | Otsuka | |
| 2005/0136641 A1* | 6/2005 | Rinne | H01L 24/11 438/612 |
| 2008/0036086 A1 | 2/2008 | Ishio | |
| 2012/0202561 A1* | 8/2012 | Robinett | H04B 7/0871 455/552.1 |
| 2014/0042870 A1* | 2/2014 | Ohashi | H03H 3/08 310/313 R |
| 2014/0130319 A1* | 5/2014 | Iwamoto | H03H 3/02 29/25.35 |
| 2015/0214164 A1 | 7/2015 | Matocha et al. | |

\* cited by examiner

OPEN-PASSIVATION BALL GRID ARRAY PADS

CROSS-REFERENCE TO RELATED APPLICATION

This application claims the benefit under 35 U.S.C. § 119(e) to U.S. Provisional Patent Application No. 62/289,636, entitled "OPEN-PASSIVATION BALL GRID ARRAY PADS," filed on Feb. 1, 2016, the disclosure of which is expressly incorporated by reference herein in its entirety.

TECHNICAL FIELD

The present disclosure generally relates to integrated circuits (ICs). More specifically, the present disclosure relates to open-passivation ball grid array pads.

BACKGROUND

The process flow for semiconductor fabrication of integrated circuits (ICs) may include front-end-of-line (FEOL), middle-of-line (MOL), and back-end-of-line (BEOL) processes. The front-end-of-line process may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other active devices. The back-end-of-line process may include a series of wafer processing steps for interconnecting the semiconductor devices created during the front-end-of-line and middle-of-line processes.

Successful fabrication of modern semiconductor chip products involves interplay between the materials and the processes employed. In particular, the formation of conductive material plating for the semiconductor fabrication in the back-end-of-line processes is an increasingly challenging part of the process flow. This is particularly true in terms of maintaining a small feature size. The same challenge of maintaining a small feature size also applies to passive on glass (POG) technology, where high-performance components such as inductors and capacitors are built upon a highly insulative substrate that may also have a very low loss.

Passive on glass devices involve high-performance inductor and capacitor components that have a variety of advantages over other technologies, such as surface mount technology or multi-layer ceramic chips that are commonly used in the fabrication of mobile radio frequency (RF) chip designs (e.g., mobile RF transceivers). The design complexity of mobile RF transceivers is complicated by the migration to a deep sub-micron process node due to cost and power consumption considerations. Spacing considerations also affect mobile RF transceiver design deep sub-micron process node. For example, fabrication of mobile RF transceivers may include a dummy area at a die area boundary that occupies wasted space and involves an increased cost.

SUMMARY

A conductive bump assembly may include a passive substrate. The conductive bump assembly may also include a conductive bump pad supported by the passive substrate and surrounded by a first passivation layer opening. The conductive bump assembly may further include a second passivation layer opening on the passive substrate. The second passivation layer opening may be merged with the first passivation layer opening surrounding the conductive bump pad proximate an edge of the passive substrate. The conductive bump assembly may also include a conductive bump on the conductive bump pad.

A method for fabricating a conductive bump assembly may include fabricating a conductive bump pad at an edge of a passive substrate supporting the conductive bump assembly. The method may also include merging a first passivation layer opening surrounding the conductive bump pad with a second passivation layer opening. The second passivation layer opening may surround the conductive bump pad proximate the edge of the passive substrate. The method may further include depositing a conductive material on the conductive bump pad.

A conductive bump assembly may include a passive substrate. The conductive bump assembly may also include a conductive bump pad supported by the passive substrate and surrounded by a first passivation layer opening. The conductive bump assembly may further include a second passivation layer opening on the passive substrate. The second passivation layer opening may be merged with the first passivation layer opening surrounding the conductive bump pad proximate an edge of the passive substrate. The conductive bump assembly may also include means for assembling on the conductive bump pad.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
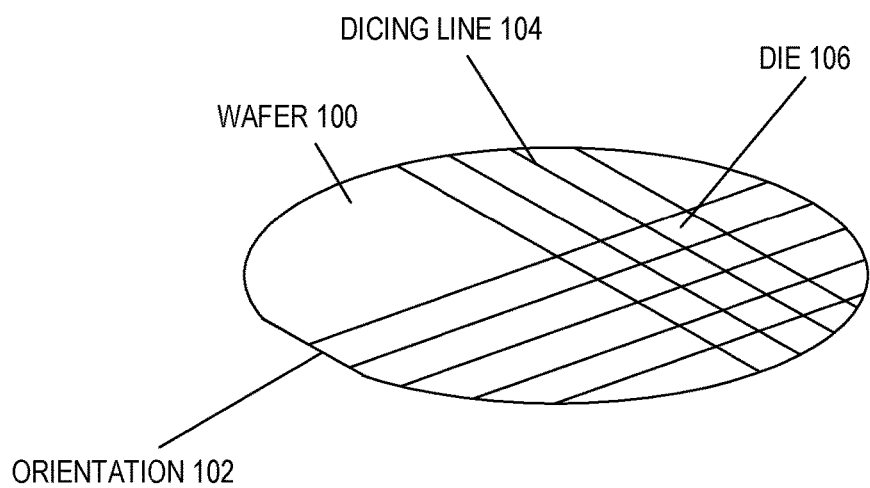
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Successful fabrication of modern semiconductor chip products involves interplay between the materials and the processes employed. In particular, the formation of conductive material plating for the semiconductor fabrication in the back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss.

Passive on glass devices involve high-performance inductor and capacitor components that have a variety of advantages over other technologies, such as surface mount technology or multi-layer ceramic chips that are commonly used in the fabrication of mobile radio frequency (RF) chip designs (e.g., mobile RF transceivers). The design complexity of mobile RF transceivers is complicated by the migration to a deep sub-micron process node due to cost and power consumption considerations. Spacing considerations also affect mobile RF transceiver design deep sub-micron process node. For example, fabrication of mobile RF transceivers may include a dummy area at a die area boundary that occupies wasted space and involves an increased cost.

Various aspects of the disclosure provide techniques for open-passivation ball grid array pads. The process flow for semiconductor fabrication of the open-passivation ball grid array pads may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

As described herein, the back-end-of-line interconnect layers may refer to the conductive interconnect layers (e.g., metal one (M1), metal two (M2), metal three (M3), metal four (M4), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers.

Various aspects of the disclosure provide techniques for reducing a dummy area at a die area boundary for providing a cost reduction. Generally, once fabrication of integrated circuits on a wafer is complete, the wafer is divided up along dicing lines (e.g., a dicing street). The dicing lines indicate where the wafer is to be broken apart or separated into pieces. The dicing lines may define the outline of the various integrated circuits that have been fabricated on the wafer. Once the dicing lines are defined, the wafer may be sawn or otherwise separated into pieces to form the die. Following this process, a die area boundary may include a non-functional boundary area according to a groove created by a dicing saw blade (Kerf) and a final passivation layer (VP) spacing. In this example, a width of the non-functional boundary area results in a dummy area that may be a significant percentage of the physical die area.

In one aspect of the present disclosure, a conductive bump assembly including open-passivation ball grid array pads enables reduction of a dummy area at a die area boundary. The conductive bump assembly may include a conductive bump pad supported by a passive substrate and surrounded by a first passivation layer opening. The conductive bump assembly may also include a second passivation layer opening on the passive substrate and merged with the first passivation layer opening surrounding the conductive bump pad proximate an edge of the passive substrate. In this arrangement, a first passivation layer block between the conductive bump pad and a dicing street is removed at the edge of a passive substrate supporting the conductive bump assembly. Once removed, a first passivation layer opening surrounding the conductive bump pad is merged with a second passivation layer opening surrounding the conductive bump pad, proximate the dicing street at the edge of the passive substrate.

FIG. 1 illustrates a perspective view of a wafer in an aspect of the present disclosure. A wafer 100 may be a semiconductor wafer, or may be a substrate material with one or more layers of material on a surface of the wafer 100. The wafer 100 may be a compound material, such as gallium arsenide (GaAs) or gallium nitride (GaN), a ternary material such as indium gallium arsenide (InGaAs), quaternary materials, silicon, quartz, glass, or any material that can be a substrate material. Although many of the materials may be crystalline in nature, polycrystalline or amorphous materials may also be used for the wafer 100. For example, various options for the substrate include a glass substrate, a semiconductor substrate, a core laminate substrate, a coreless substrate, a printed circuit board (PCB) substrate, or other like substrates.

The wafer 100, or layers that are coupled to the wafer 100, may be supplied with materials that enable formation of different types of electronic devices in or on the wafer 100. In addition, the wafer 100 may have an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100, assuming a semiconductor wafer.

Once the wafer 100 has been processed as desired, the wafer 100 is divided up along dicing lines 104. For example, once fabrication of integrated circuits on the wafer 100 is complete, the wafer 100 is divided up along the dicing lines 104, which may be referred to herein as "dicing streets." The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 6:
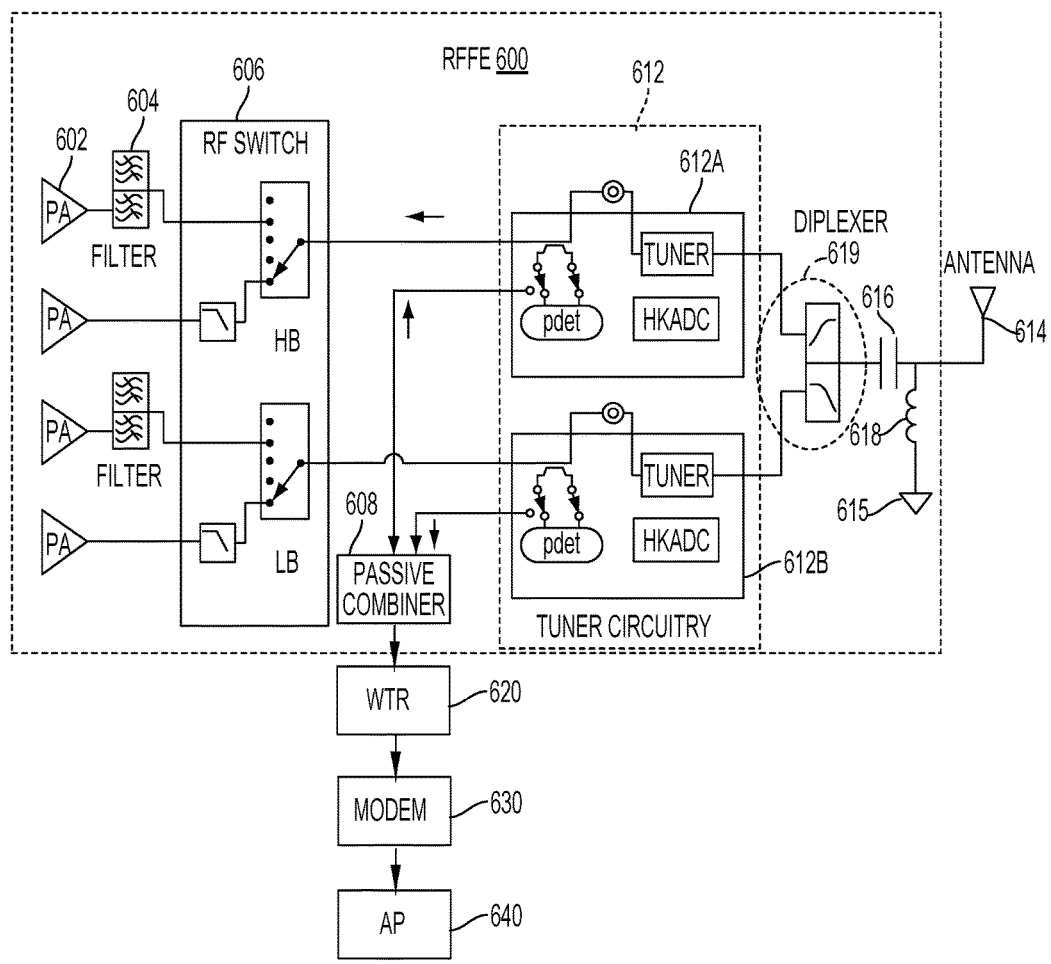
FIG. 6 is a schematic diagram of a radio frequency (RF) front end (RFFE) module employing a diplexer according to an aspect of the present disclosure.
Figure 7:
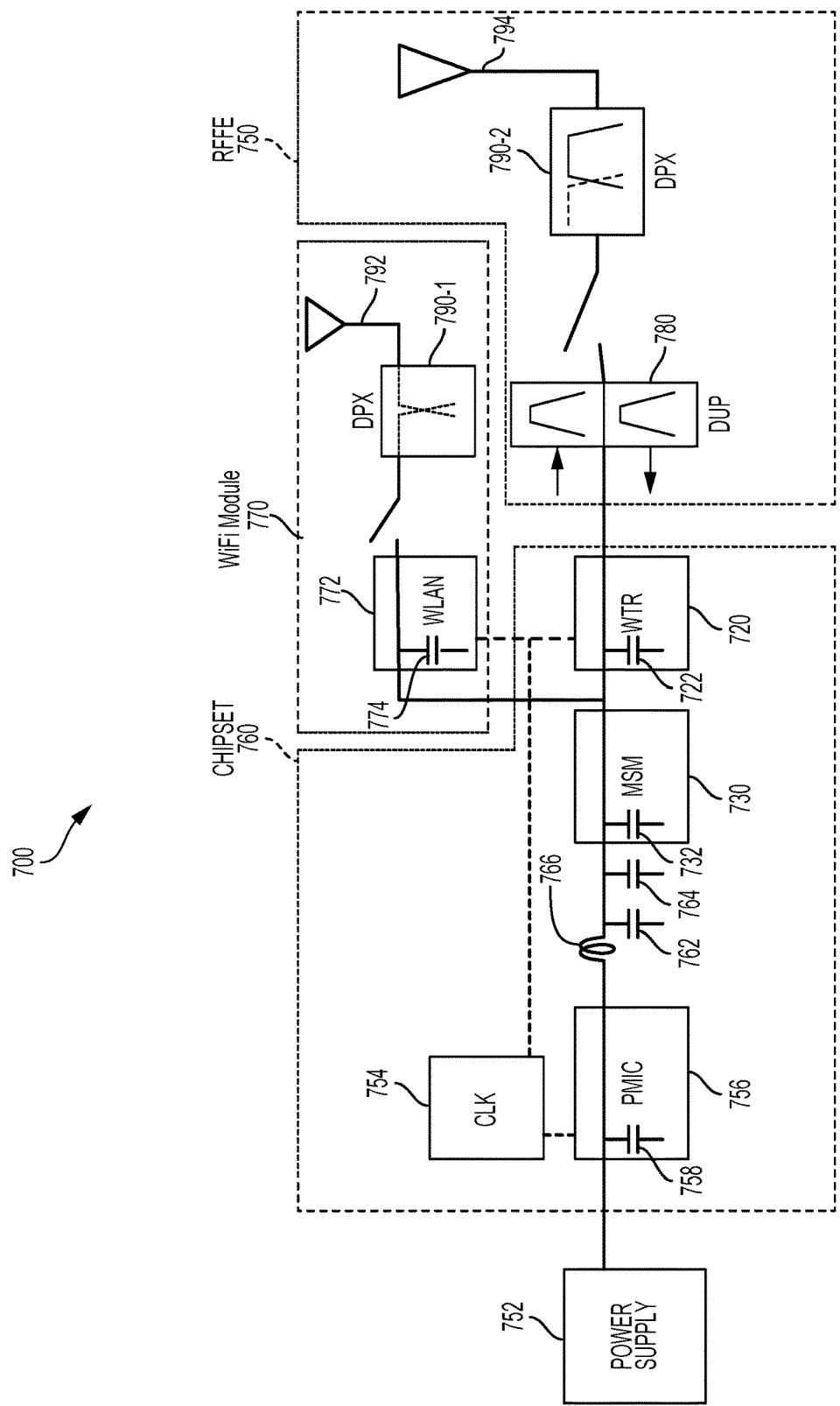
FIG. 7 is a schematic diagram of a WiFi module and a radio frequency (RF) front end (RFFE) module employing diplexers for a chipset to provide carrier aggregation according to aspects of the present disclosure.

Inductors, as well as other passive devices such as capacitors, may be formed on the die. These components may be used to form a filter, a diplexer, a triplexer, a low pass filter, and/or a notch filter, or other like passive circuit elements useful in the formation of radio frequency (RF) front end modules, for example, as shown in FIGS. 6 and 7, using passive on glass technology.

Figure 2A:
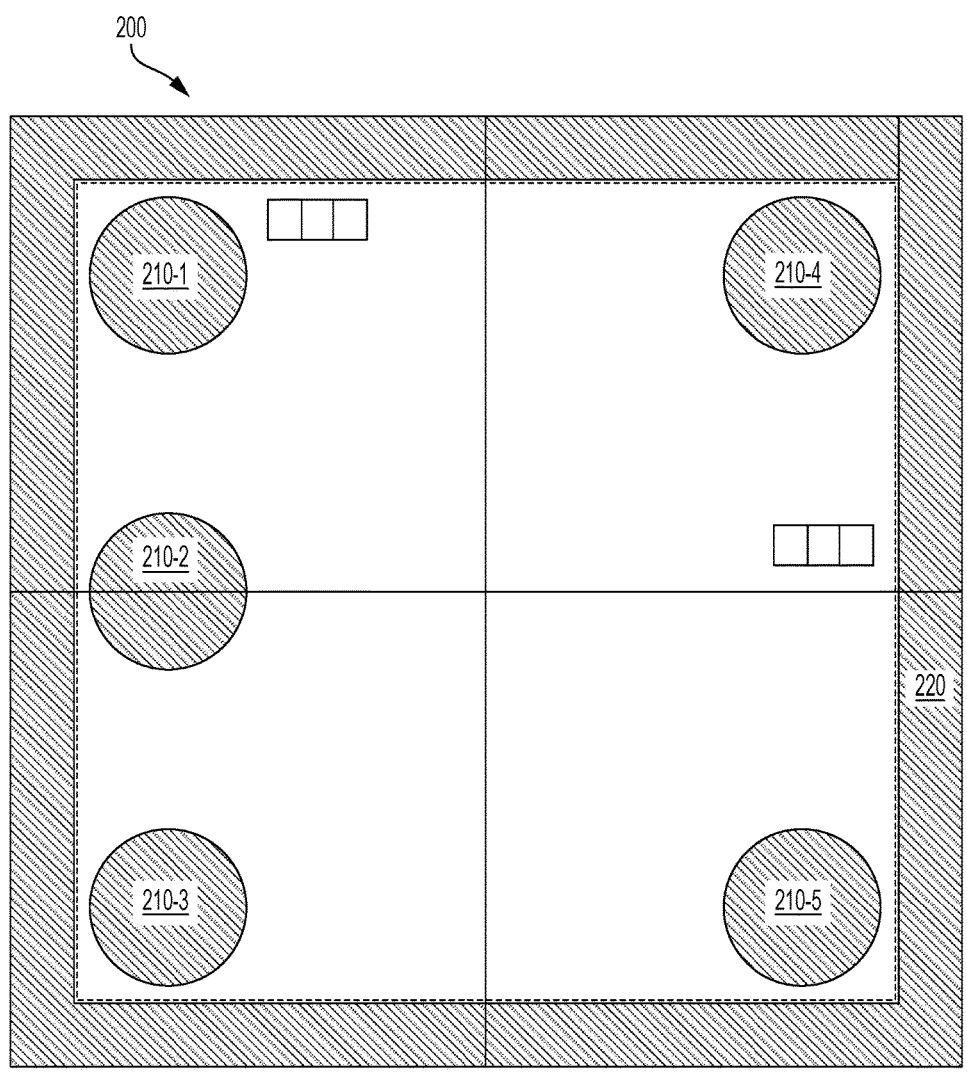
FIG. 2A illustrates a glass die of a wafer after fabrication of passive on glass devices on the wafer.

FIG. 2A illustrates a glass die 200 of a wafer 201 (FIG. 2B) after fabrication of passive on glass devices on the wafer 201. Passive on glass devices involve high-performance inductor and capacitor components that have a variety of advantages over other technologies, such as surface mount technology or multi-layer ceramic chips that are commonly used in the fabrication of mobile radio frequency (RF) chip designs (e.g., mobile RF transceivers). In this arrangement, the glass die 200 includes passivation openings 210 (210-1, 210-2, 210-3, 210-4, and 210-4) to enable placement of a ball grid array (BGA) assembly. In this example, the glass die is shown prior to dicing along dicing lines, such that the glass die is surrounded by a dicing street 220. The dicing street 220 is composed of dicing lines that indicate where the wafer 201 is to be broken apart or separated into pieces. Once the dicing street 220 is defined, the wafer 201 may be sawn or otherwise separated into pieces to form the glass die 200. Unfortunately, the arrangement of the passivation openings 210 results in a dummy area at a die area boundary of the glass die 200, as further illustrated in FIG. 2B.

Figure 2B:
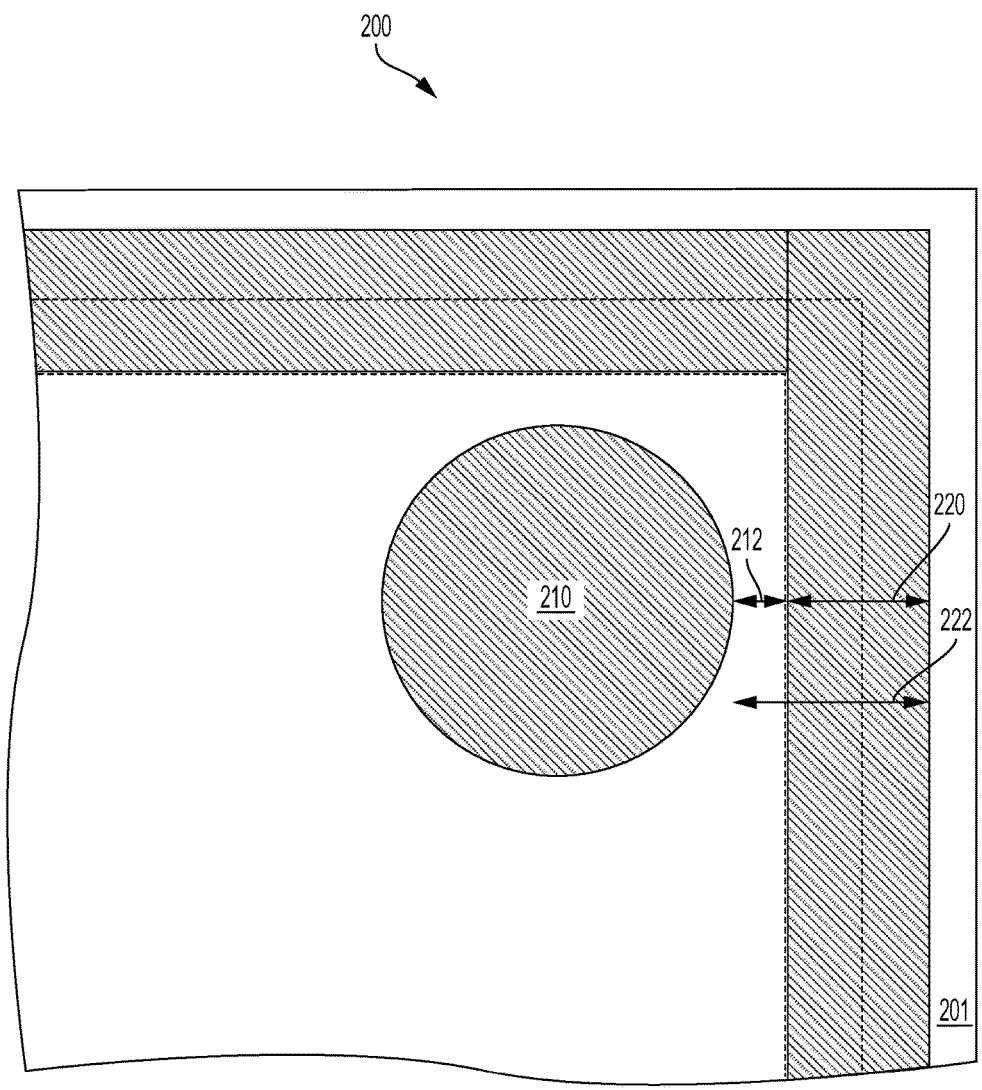
FIG. 2B provides a zoomed in view of a corner of the glass die of FIG. 2A.

FIG. 2B, provides a zoomed in view of a corner of the glass die 200 of FIG. 2A. Fabrication of passive on glass devices is costly due to the non-functional boundary area 222 surrounding the glass die 200. For example, assuming that a physical die size of the glass die 200 is 2.25 mm$^2$, a die area boundary may include an non-functional boundary area according to a groove (e.g., a portion of the dicing street 220) created by a dicing saw blade (Kerf) and a final passivation layer (VP) spacing 212. In this example, a width of the non-functional boundary area 222 is 0.78 mm$^2$, which results in a dummy area that is approximately 35% of the physical die area of the glass die 200. In this arrangement, a distance between a passivation opening and the dicing street 220 at the edge of the glass die is approximately 85 microns.

Figure 3A:
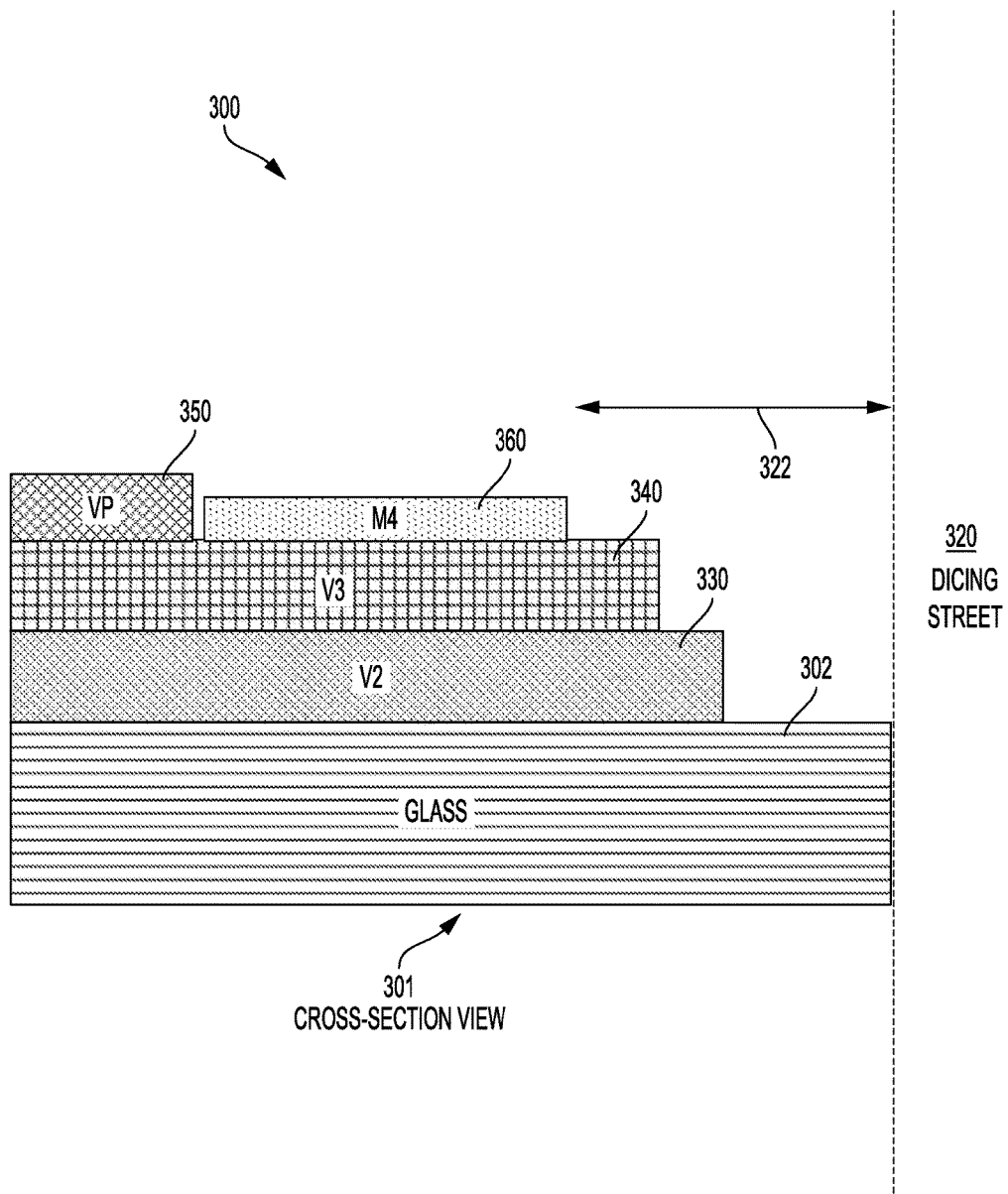
FIG. 3A shows a cross section view of conductive bump assembly including an open-passivation conductive pad according to an aspect of the present disclosure.

FIG. 3A shows a cross section view 301 of a conductive bump assembly including an open-passivation conductive bump pad according to an aspect of the present disclosure. The open-passivation conductive bump pad enables assembly of a passive on glass device in an RF front end module using surface mount technology (SMT). A SMT assembly process may include screen printing solder paste on a wafer (e.g., a printed circuit board (PCB)). Following the solder paste printing, components are placed on the wafer. Once placement of the components is complete, solder reflow is performed, followed by flux removal. In addition, the SMT assembly process generally includes two types of land patterns for the surface mount packages. The first type of land patterns are non-solder mask defined (NSMD) pads. These pads generally have a wider mask opening than metal pads. The second type of land patterns are solder mask defined (SMD) pads. These pads have a reduced solder mask opening compared to metal pads.

As shown in the cross section view 301 of FIG. 3A, a conductive bump assembly 300 includes a glass substrate 302, supporting multiple passivation (e.g., dielectric) layers and a conductive bump pad 360. The conductive bump assembly 300 shown in the cross section view 301 may be similar to the exploded view of the corner of the glass die 200 of FIG. 2A shown in FIG. 2B. In this arrangement, however, the conductive bump pad 360 is merged to the dicing street 320 by removing the VP spacing 212 shown in FIG. 2B. As a result, a non-functional boundary area 322 shown in the layout view 303 is reduced relative to the non-functional boundary area 222 shown in FIG. 2B.

As shown in the cross section view 301, a first passivation layer 350 (VP) is supported by a second passivation layer 340 (V3) that is supported by a third passivation layer 330 (V2). As shown relative to the cross section view 371 of FIG. 3B, a second passivation layer opening of the second passivation layer 340 (V3) is merged with a first passivation layer opening of the first passivation layer 350 (VP) surrounding the conductive bump pad 360 proximate the dicing street 320. The conductive bump pad 360 may be formed by depositing a back-end-of-line (BEOL) interconnect layer (e.g., metal four (M4)) on the second passivation layer 340. The conductive bump pad 360 may be a non-solder mask defined (NSMD) pad. Although shown as three passivation layers, the conductive bump assembly is not limited to this arrangement and may include any arrangement including multiple passivation layers that are deposited during different stages of wafer fabrication. The passivation layers may be composed of polyimide or other like dielectric material.

Figure 3B:
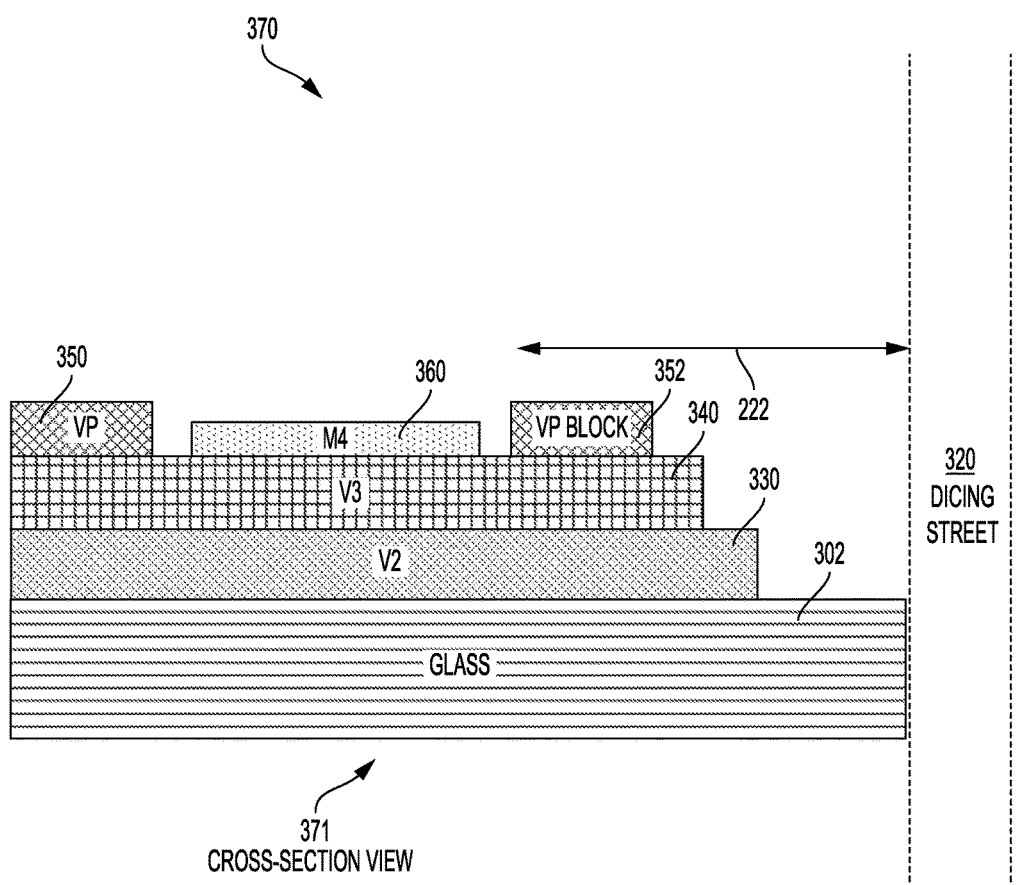
FIG. 3B shows a cross section view of a conductive bump assembly of the glass die shown in FIGS. 2A and 2B.

FIG. 3B shows a cross section view 371 of a conductive bump assembly of the glass die 200 shown in FIGS. 2A and 2B. As shown in the cross section view 371 of FIG. 3B, a conductive bump assembly 370 includes the glass substrate 302, supporting multiple passivation (e.g., dielectric) layers and a conductive bump pad 360. The conductive bump assembly 300 shown in the cross section view 301 further illustrates the exploded view of the corner of the glass die 200 of FIG. 2A shown in FIG. 2B. In this arrangement, the conductive bump pad 360 is offset from the dicing street 320 by the VP block 352 of the first passivation layer 350 according to a VP spacing 212 (e.g., 42.5 microns) shown in the layout view 373.

As shown in the cross section view 371, the VP block 352 is arranged between the conductive bump pad 360 and the dicing street 320, which contributes to a non-functional boundary area 222 shown in the layout view 373. In particular, the VP block 352 contributes to a dummy area at the perimeter of the glass die 200 as measured by the VP spacing 212 shown in the layout view 373. Consequently, the non-functional boundary area 222 (e.g., 85 microns) shown in the layout view 373 of FIG. 3B is larger relative to the non-functional boundary area 322 (e.g., 42.5 microns) shown in FIG. 3A. In aspects of the present disclosure, the non-functional boundary area 322 is reduced according to the width of the VP spacing 212 by removing VP block 352 and merging the conductive bump pad 360 with the dicing street 320, as shown in FIG. 3A.

Figure 4A:
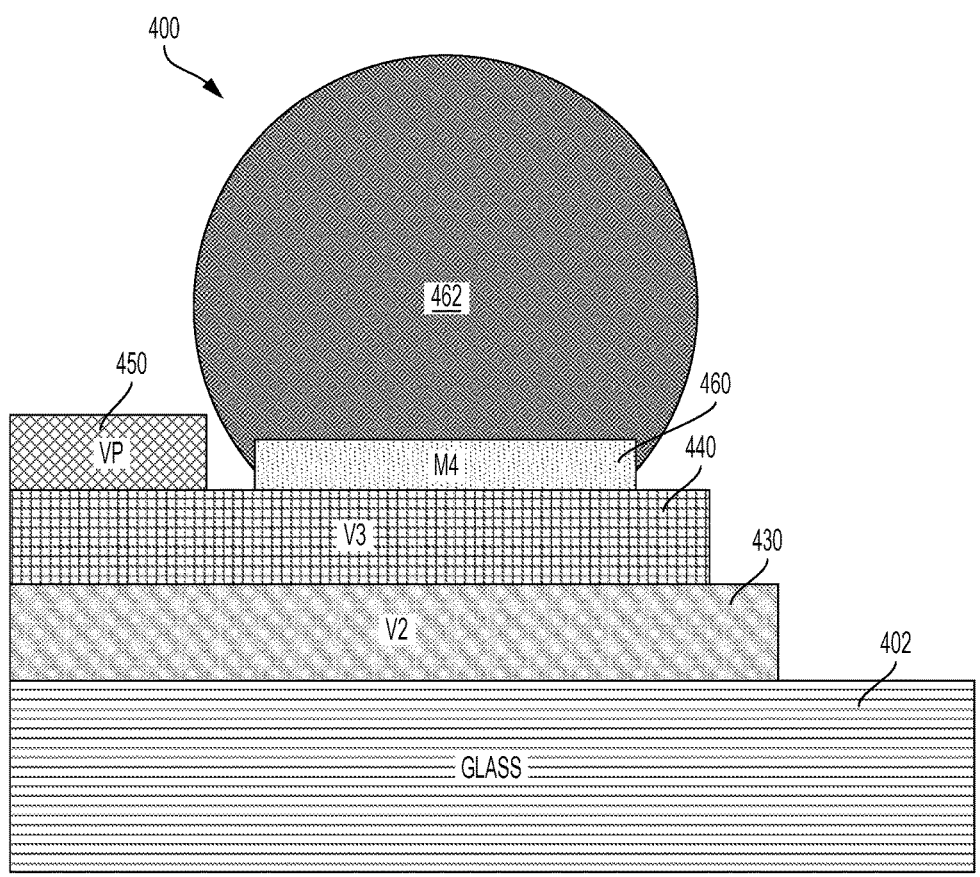
FIG. 4A shows a cross section view of a conductive bump assembly including an open-passivation conductive bump pad according to an aspect of the present disclosure.

FIG. 4A shows a cross section view of a conductive bump assembly including an open-passivation conductive bump pad according to an aspect of the present disclosure. Representatively, the conductive bump assembly 400 also includes a glass substrate 402, supporting passivation (e.g., dielectric) layers and a conductive bump pad 460. The conductive bump assembly 400 may be similar to the conductive bump assembly 300 shown in FIG. 3A. In this arrangement, however, a conductive bump 462 is fabricated on the conductive bump pad 460 to complete the conductive bump assembly 400.

The conductive bump assembly 400 includes a first passivation layer 450 (VP) supported by a second passivation layer 440 (V3) that is supported by a third passivation layer 430 (V2). In this arrangement, a second passivation layer opening of the second passivation layer 440 (V3) is also merged with a first passivation layer opening of the first passivation layer 450 (VP) surrounding the conductive bump pad 460. This process provides the conductive bump assembly 400 with a reduced foot print (e.g., 1.5×1.5 mm²) by pushing a location of the conductive bump pad 460 closer to the dicing street 320 (FIG. 3A). The reduced footprint of the conductive bump assembly 400 includes a significant side reduction (e.g., 85 microns) by removing the VP block 452, as shown in FIG. 4B.

Figure 4B:
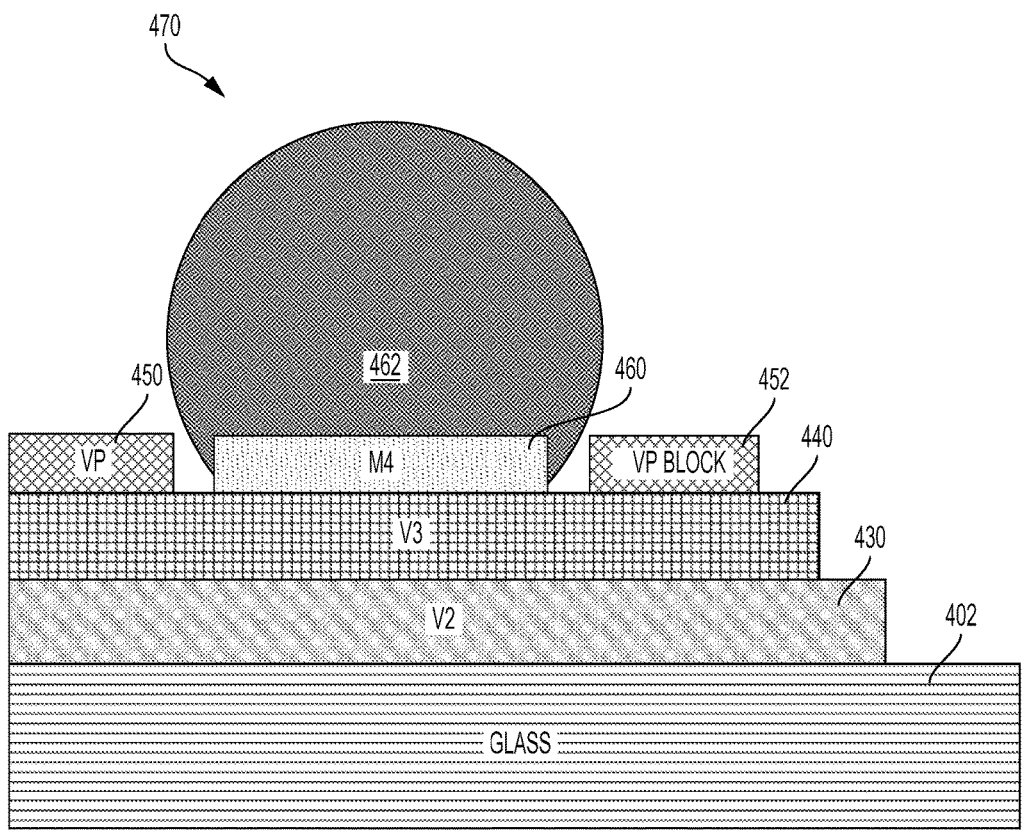
FIG. 4B further illustrates the cross section view of the conductive bump assembly shown in FIG. 3B.

FIG. 4B further illustrates the cross section view of the conductive bump assembly shown in FIG. 3B. The conductive bump assembly 470 may be similar to the conductive bump assembly 370 shown in FIG. 3B, including the first passivation layer 450 (VP) supported by the second passivation layer 440 (V3) that is supported by the third passivation layer 430 (V2) on the glass substrate 402. In this arrangement, however, a conductive bump 462 is fabricated on the conductive bump pad 460 to complete the conductive bump assembly 470.

In this arrangement, the conductive bump pad 460 is offset from the dicing street 320 (FIG. 3B) by the VP block 452 of the first passivation layer 450. The space consumed by the VP block 452 provides the conductive bump assembly 470 with an increased footprint (e.g., 1.6×1.6 mm²) relative to the reduced footprint (e.g., 1.5×1.5 mm²) of the conductive bump assembly 400 shown in FIG. 4A. The reduced footprint of the conductive bump assembly 400 includes a substantial size reduction (e.g., 11%) by removing the VP block 452, as shown in FIG. 4B. Removal of the VP block 452 also enables fabrication of the conductive bump assembly 400 by avoiding the VP-to-VP spacing rule of the conductive bump assembly 470.

Figure 5:
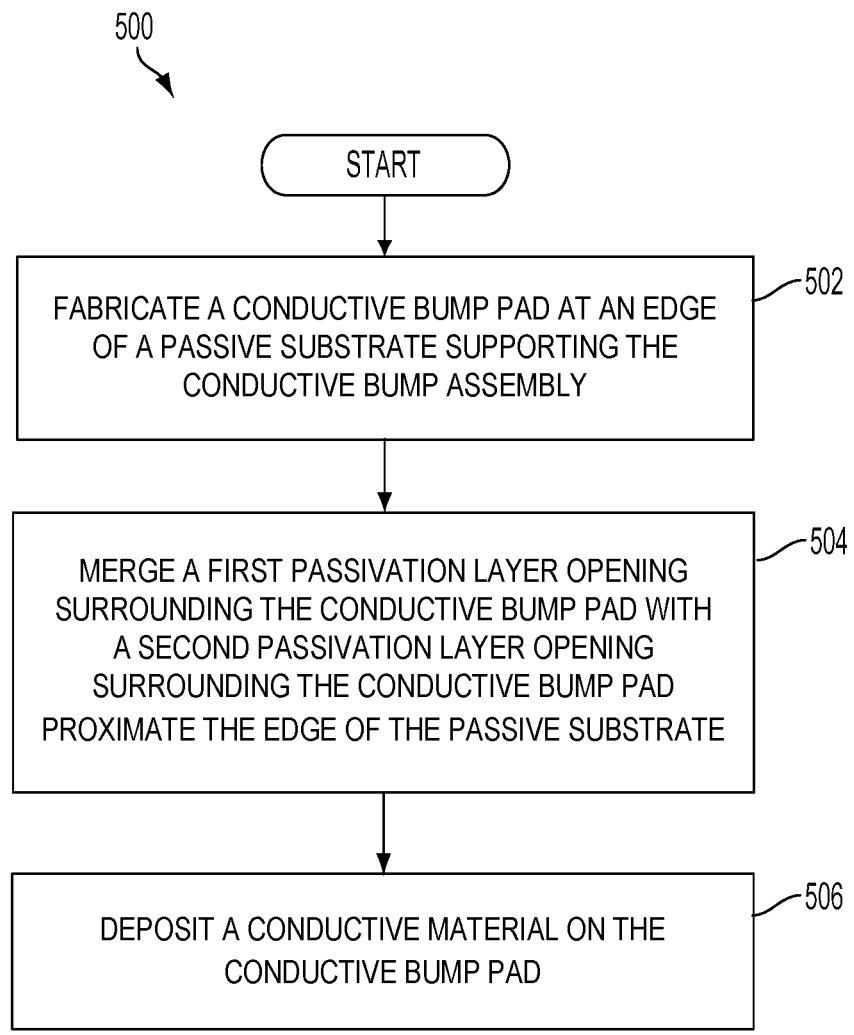
FIG. 5 is a process flow diagram illustrating a method of constructing a conductive bump assembly including an open-passivation conductive bump pad according to aspects of the present disclosure.

FIG. 5 is a process flow diagram illustrating a method 500 of constructing a conductive bump assembly including an open-passivation conductive bump pad according to an aspect of the present disclosure. In block 502, a conductive bump pad is fabricated at an edge of a passive substrate supporting the conductive bump assembly. For example, as shown in FIG. 3A, the conductive bump pad 360 may be formed by depositing a back-end-of-line (BEOL) conductive interconnect layer (e.g., metal four (M4)) on the second passivation layer 340 proximate the dicing street 320 at the edge of the glass substrate 302. In this arrangement, a location of the conductive bump pad 360 is pushed to the dicing street 320 by removing the VP block 352 shown in FIG. 3B.

Referring again to FIG. 5, in block 504, a first passivation layer opening surrounding the conductive bump pad is merged with a second passivation layer opening surrounding the conductive bump pad proximate the edge of the glass substrate. For example, as shown in the layout view 303 of FIG. 3A, a second passivation layer opening of the second passivation layer 340 (V3) is merged with a first passivation layer opening of the first passivation layer 350 (VP) surrounding the conductive bump pad 360 proximate the dicing street 320. In block 506 of FIG. 5, a conductive material is deposited on the conductive bump pad.

As shown in FIG. 4A, a conductive bump 462 is fabricated on the conductive bump pad 460 to complete the conductive bump assembly 400. In this arrangement, the conductive bump 462 is fabricated by depositing a solder material on the conductive bump pad on the conductive bump pad 460 to form the conductive bump 462 as a solder ball. This process may be performed by first defining a landing pattern on the second passivation layer 440 using a non-solder mask defined (NSMD) process.

According to a further aspect of the present disclosure, a conductive bump assembly including an open-passivation conductive bump pad is described. The conductive bump assembly includes a second passivation layer opening on a passive substrate merged with a first passivation layer opening surrounding the conductive bump pad proximate an edge of the passive substrate. The conductive bump assembly also includes means for assembling on a conductive bump pad. The assembling means may be the conductive bump 462, shown in FIG. 4A. In another aspect, the aforementioned means may be any layer, module, or any apparatus configured to perform the functions recited by the aforementioned means.

Various aspects of the disclosure provide techniques for reducing a dummy area at a die area boundary to enable a low cost, high performance RF device technology platform for RF front end and carrier aggregation applications. Generally, once fabrication of integrated circuits on a wafer is complete, the wafer is divided up along dicing lines (e.g., dicing streets). The dicing lines indicate where the wafer is to be broken apart or separated into pieces. The dicing lines may define the outline of the various integrated circuits that have been fabricated on the wafer. Once the dicing lines are defined, the wafer may be sawn or otherwise separated into pieces to form the die. Following this process, a die area boundary may include a non-functional boundary area according to a groove created by a dicing saw blade (Kerf) and a final passivation layer (VP) spacing. In this example, a width of the non-functional boundary area results in a dummy area that may be a significant percentage of the physical die area.

In one aspect of the present disclosure, a conductive bump assembly including open-passivation ball grid array pads enables reduction of a dummy area at a die area boundary. The conductive bump assembly may include a conductive bump pad supported by a passive substrate and surrounded by a first passivation layer opening. The conductive bump assembly may also include a second passivation layer opening on the passive substrate and merged with the first passivation layer opening surrounding the conductive bump pad proximate an edge of the passive substrate. In this arrangement, a first passivation layer block between the conductive bump pad and a dicing street is removed at the edge of a passive substrate supporting the conductive bump assembly. Once removed, a first passivation layer opening surrounding the conductive bump pad is merged with a second passivation layer opening surrounding the conductive bump pad, proximate the dicing street at the edge of the passive substrate.

FIG. 6 is a schematic diagram of a radio frequency (RF) front end (RFFE) module 600 employing passive on glass devices including open-passivation ball grid array pads according to an aspect of the present disclosure. The RF front end module 600 includes power amplifiers 602, duplexer/filters 604, and a radio frequency (RF) switch module 606. The power amplifiers 602 amplify signal(s) to a certain power level for transmission. The duplexer/filters 604 filter the input/output signals according to a variety of different parameters, including frequency, insertion loss, rejection or other like parameters. In addition, the RF switch module 606 may select certain portions of the input signals to pass on to the rest of the RF front end module 600.

The RF front end module 600 also includes tuner circuitry 612 (e.g., first tuner circuitry 612A and second tuner circuitry 612B), a diplexer 619, a capacitor 616, an inductor 618, a ground terminal 615 and an antenna 614. The tuner circuitry 612 (e.g., the first tuner circuitry 612A and the second tuner circuitry 612B) includes components such as a tuner, a portable data entry terminal (PDET), and a house keeping analog to digital converter (HKADC). The tuner circuitry 612 may perform impedance tuning (e.g., a voltage standing wave ratio (VSWR) optimization) for the antenna 614. The RF front end module 600 also includes a passive combiner 108 coupled to a wireless transceiver (WTR) 620. The passive combiner 608 combines the detected power from the first tuner circuitry 612A and the second tuner circuitry 612B. The wireless transceiver 620 processes the information from the passive combiner 108 and provides this information to a modem 630 (e.g., a mobile station modem (MSM)). The modem 630 provides a digital signal to an application processor (AP) 640.

As shown in FIG. 6, the diplexer 619 is between the tuner component of the tuner circuitry 612 and the capacitor 616, the inductor 618, and the antenna 614. The diplexer 619 may be placed between the antenna 614 and the tuner circuitry 612 to provide high system performance from the RF front end module 600 to a chipset including the wireless transceiver 620, the modem 630 and the application processor 640. The diplexer 619 also performs frequency domain multiplexing on both high band frequencies and low band frequencies. After the diplexer 619 performs its frequency multiplexing functions on the input signals, the output of the diplexer 619 is fed to an optional LC (inductor/capacitor) network including the capacitor 616 and the inductor 618. The LC network may provide extra impedance matching components for the antenna 614, when desired. Then a signal with the particular frequency is transmitted or received by the antenna 614. Although a single capacitor and inductor are shown, multiple components are also contemplated.

FIG. 7 is a schematic diagram 700 of a WiFi module 770 including a first diplexer 790-1 and an RF front end module 750 including a second diplexer 790-2 for a chipset 760 to provide carrier aggregation according to an aspect of the present disclosure. The WiFi module 770 includes the first diplexer 790-1 communicably coupling an antenna 792 to a wireless local area network module (e.g., WLAN module 772). The RF front end module 750 includes the second diplexer 790-2 communicably coupling an antenna 794 to the wireless transceiver (WTR) 720 through a duplexer 780. The wireless transceiver 720 and the WLAN module 772 of the WiFi module 770 are coupled to a modem (MSM, e.g., baseband modem) 730 that is powered by a power supply 752 through a power management integrated circuit (PMIC) 756. The chipset 760 also includes capacitors 762 and 764, as well as an inductor(s) 766 to provide signal integrity. The PMIC 756, the modem 730, the wireless transceiver 720, and the WLAN module 772 each include capacitors (e.g., 758, 732, 722, and 774) and operate according to a clock 754. The geometry and arrangement of the various inductor and capacitor components in the chipset 760 may reduce the electromagnetic coupling between the components.

Figure 8:
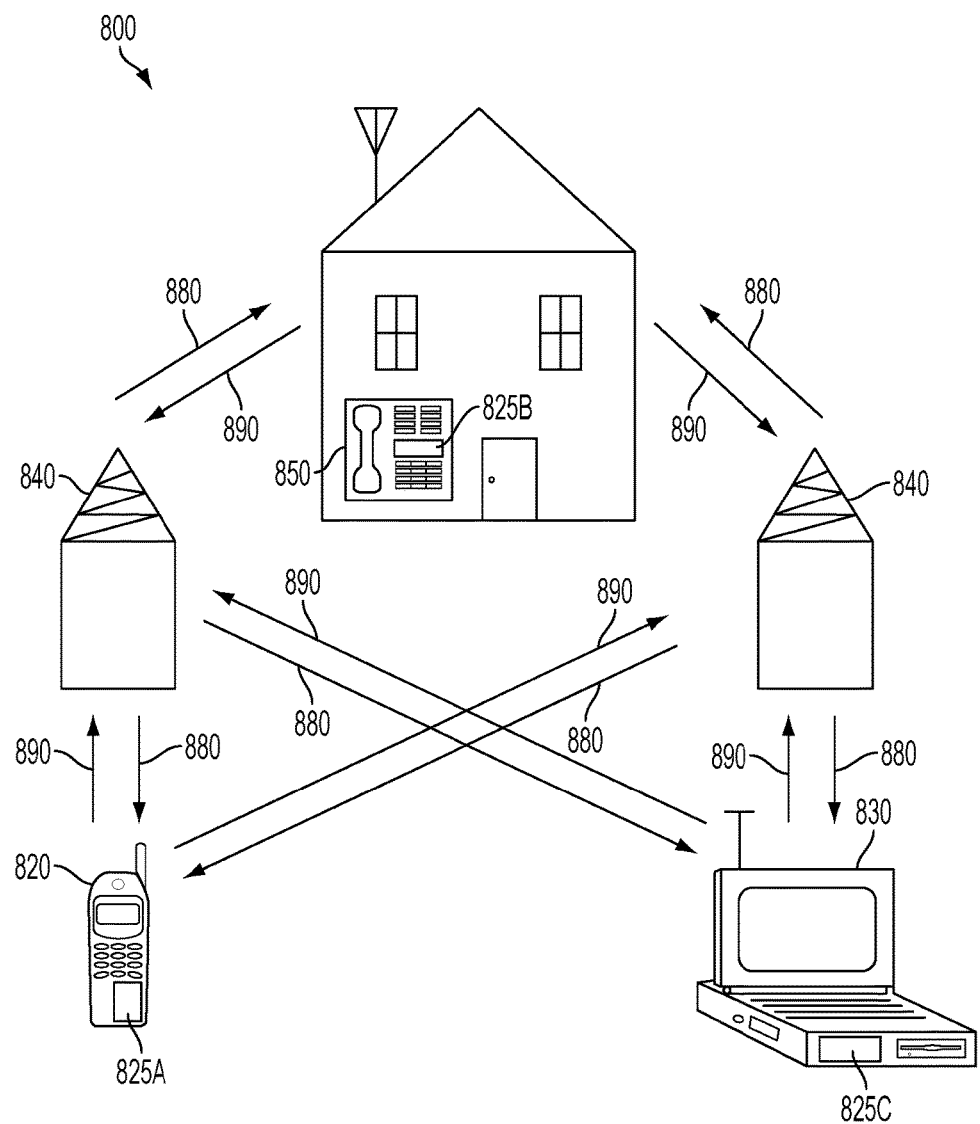
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed open-passivation ball grid array pads. It will be recognized that other devices may also include the disclosed open-passivation ball grid array pads, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed open-passivation ball grid array pads.

Figure 9:
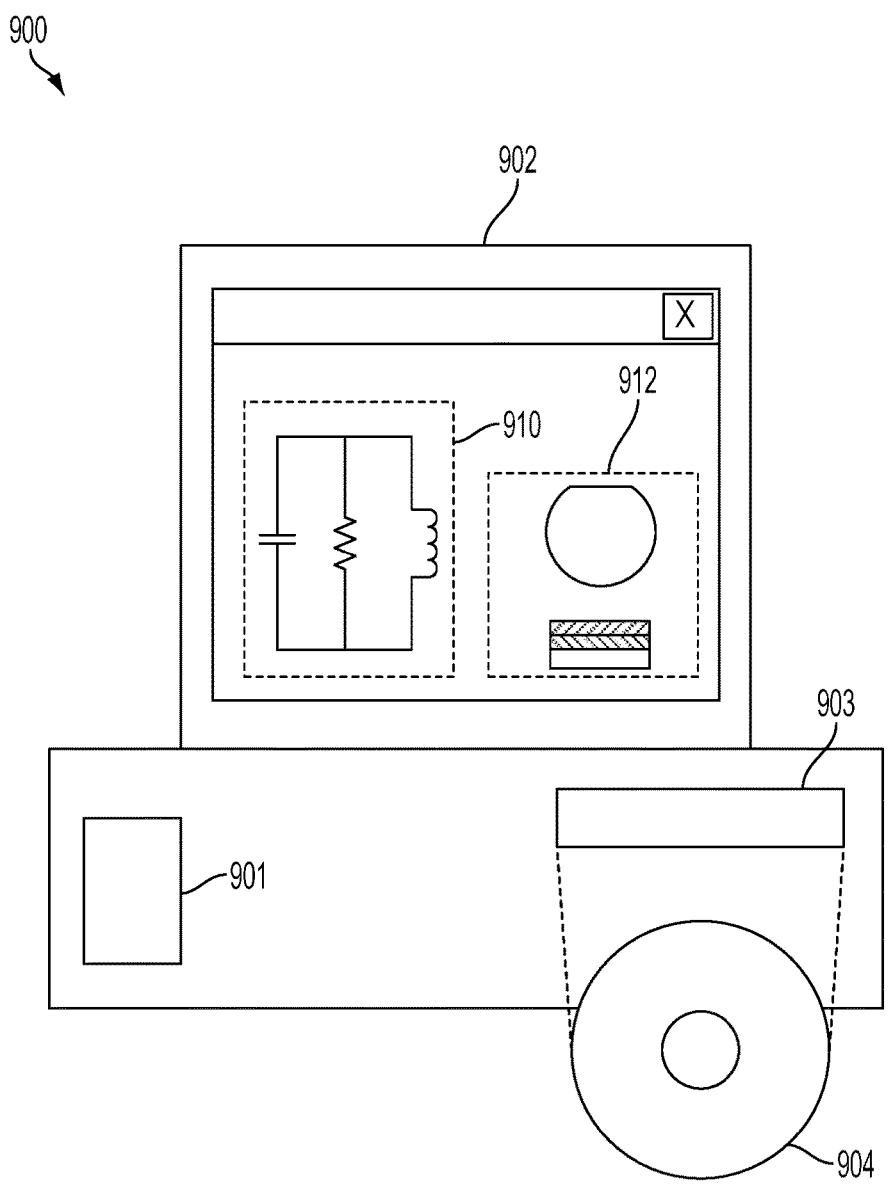
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the open-passivation ball grid array pads disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as open-passivation ball grid array pads. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A conductive bump assembly integrated into a radio frequency (RF) filter, the conductive bump assembly, comprising:
    a glass substrate;
    a third passivation layer on a surface of the glass substrate;
    a conductive bump pad surrounded by an opening in a first passivation layer;
    a second passivation layer on the third passivation layer and supporting the first passivation layer and the conductive bump pad,
    the second passivation layer having an opening exposing the surface of the glass substrate through an opening in the third passivation layer and merged with the opening in the first passivation layer, such that a first passivation layer block is eliminated between the conductive bump pad and a proximate edge of the glass substrate, exposing a surface of the second passivation layer between the conductive pad and the proximate edge of the glass substrate; and
    a conductive bump on the conductive bump pad.

2. The conductive bump assembly of claim 1, in which the conductive bump pad comprises a non-solder mask defined (NSMD) pad.

3. The conductive bump assembly of claim 1, in which a distance between the conductive bump pad and the edge of the glass substrate is approximately 42.5 microns.

4. The conductive bump assembly of claim 1, in which the proximate edge of the glass substrate comprises a portion of a dicing street.

5. The conductive bump assembly of claim 1, in which the conductive bump assembly comprises a ball grid array (BGA) assembly.

6. The conductive bump assembly of claim 1, in which the conductive bump comprises a solder ball.

7. The conductive bump assembly of claim 1, in which the RF filter comprises a diplexer, a triplexer, a low pass filter, and/or a notch filter.

8. The conductive bump assembly of claim 1, in which the RF filter is assembled on a printed circuit board (PCB) of a radio frequency (RF) front end module.

9. The conductive bump assembly of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

10. A conductive bump assembly integrated into a radio frequency (RF) filter, the conductive bump assembly, comprising:
 a glass substrate;
 a third passivation layer on a surface of the glass substrate;
 a conductive bump pad surrounded by an opening in a first passivation layer;
 a second passivation layer on the third passivation layer and supporting the first passivation layer and the conductive bump pad,
 the second passivation layer having an opening exposing the surface of the glass substrate through an opening in the third passivation layer and merged with the opening in the first passivation layer, such that a first passivation layer block is eliminated between the conductive bump pad and a proximate edge of the glass substrate, exposing a surface of the second passivation layer between the conductive pad and the proximate edge of the glass substrate; and
 means for assembling on the conductive bump pad.

11. The conductive bump assembly of claim 10, in which the conductive bump pad comprises a non-solder mask defined (NSMD) pad.

12. The conductive bump assembly of claim 10, in which a distance between the conductive bump pad and the edge of the glass substrate is approximately 42.5 microns.

13. The conductive bump assembly of claim 10, in which the proximate edge of the glass substrate comprises a portion of a dicing street.

14. The conductive bump assembly of claim 10, in which the conductive bump assembly comprises a ball grid array (BGA) assembly.

15. The conductive bump assembly of claim 10, in which the assembling means comprises a solder ball.

16. The conductive bump assembly of claim 10, in which the RF filter comprises a diplexer, a triplexer, a low pass filter, and/or a notch filter.

17. The conductive bump assembly of claim 10, in which the RF filter is assembled on a printed circuit board (PCB) of a radio frequency (RF) front end module.

18. The conductive bump assembly of claim 10, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

* * * * *